United States Patent
Bartley et al.

(10) Patent No.: US 7,309,911 B2
(45) Date of Patent: Dec. 18, 2007

(54) METHOD AND STACKED MEMORY STRUCTURE FOR IMPLEMENTING ENHANCED COOLING OF MEMORY DEVICES

(75) Inventors: Gerald Keith Bartley, Rochester, MN (US); John Michael Borkenhagen, Rochester, MN (US); William Hugh Cochran, Rochester, MN (US); William Paul Hovis, Rochester, MN (US); Paul Rudrud, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 189 days.

(21) Appl. No.: 11/138,939

(22) Filed: May 26, 2005

(65) Prior Publication Data

US 2006/0268519 A1 Nov. 30, 2006

(51) Int. Cl.
*H01L 23/495* (2006.01)

(52) U.S. Cl. ...................... 257/675; 257/707; 257/713; 257/719

(58) Field of Classification Search ................ 257/675, 257/657, 707, 713, 719
See application file for complete search history.

(56) References Cited

U.S. PATENT DOCUMENTS

| | | | |
|---|---|---|---|
| 6,861,287 B2 * | 3/2005 | Farrar et al. ................. | 438/109 |
| 2002/0053726 A1 * | 5/2002 | Mikubo et al. ............. | 257/685 |
| 2005/0101056 A1 * | 5/2005 | Song et al. ................. | 438/109 |
| 2005/0133897 A1 * | 6/2005 | Baek et al. ................. | 257/686 |
| 2005/0141199 A1 * | 6/2005 | Chiou et al. ................ | 361/704 |

* cited by examiner

*Primary Examiner*—Wai-Sing Louie
(74) *Attorney, Agent, or Firm*—Joan Pennington

(57) ABSTRACT

A method and structure are provided for implementing enhanced cooling of a plurality of memory devices. The memory structure includes a stack of platters. A sub-plurality of memory devices is mounted on each platter. At least one connector is provided with each platter for connecting to the sub-plurality of memory devices. A heat sink is associated with the stack of platters for cooling the plurality of memory devices.

19 Claims, 4 Drawing Sheets

METHOD AND STACKED MEMORY STRUCTURE FOR IMPLEMENTING ENHANCED COOLING OF MEMORY DEVICES

FIELD OF THE INVENTION

The present invention relates generally to the field of semiconductor devices and electronic design and, more particularly, relates to a method and structure for implementing enhanced cooling of a plurality of memory devices, such as dynamic random access memory (DRAM) devices.

DESCRIPTION OF THE RELATED ART

Cooling limitations and granularity requirements have shaped the current standard of using dual in line memory modules (DIMMs) which plug into a parent board typically at a right angle, or in applications where physical height is a limitation on an acute angle to the board.

Sometimes design teams implement structures with DIMMS plugged into riser cards, which are then plugged into the parent board. In any event, these structures marginally allow for cooling air to flow between the DIMMs and result in longer than desirable signal net lengths when considering higher speed bus structures such as with buffered DIMMs.

A need exists for an effective mechanism for implementing enhanced cooling of a plurality of memory devices, such as, dynamic random access memory (DRAM) devices; while maintaining and preferably increasing the performance of the memory interface.

SUMMARY OF THE INVENTION

Principal aspects of the present invention are to provide a method and structure for implementing enhanced cooling of a plurality of memory devices, such as a dynamic random access memory (DRAM) devices. Other important aspects of the present invention are to provide such a method and structure for implementing enhanced cooling of a plurality of memory devices substantially without negative effect and that overcome many of the disadvantages of prior art arrangements.

In brief, a method and structure are provided for implementing enhanced cooling of a plurality of memory devices. The memory structure includes a stack of platters. A sub-plurality of memory devices is mounted on each platter. At least one connector is provided with each platter for connecting to the sub-plurality of memory devices. A heat sink is associated with the stack of platters for cooling the plurality of memory devices.

In accordance with features of the invention, a heat spreader is provided between at least some of the platters in the stack of platters. A heat pipe is connected to an edge of the heat spreader. The heat sink includes a unitary member mounted on the stack of platters. A heat path is provided from each heat spreader to the heat sink unitary member mounted on the stack of platters.

In accordance with features of the invention, a heat spreader is provided between at least some of the platters in the stack of platters with a heat sink formed at opposed sides of the heat spreader. The heat sink includes a plurality of fins extending generally perpendicular to the heat spreader.

In accordance with features of the invention, a control chip is mounted generally centrally located on the memory platter with a pair of connectors respectively located on opposite sides of and closely spaced from the control chip. Multiple memory chips are arranged near opposed edges of the platter closely spaced from the control chip. A shorter, more direct electrical path to the devices is simultaneously provided, thus increasing the electrical performance of the memory interface.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Figure 1:
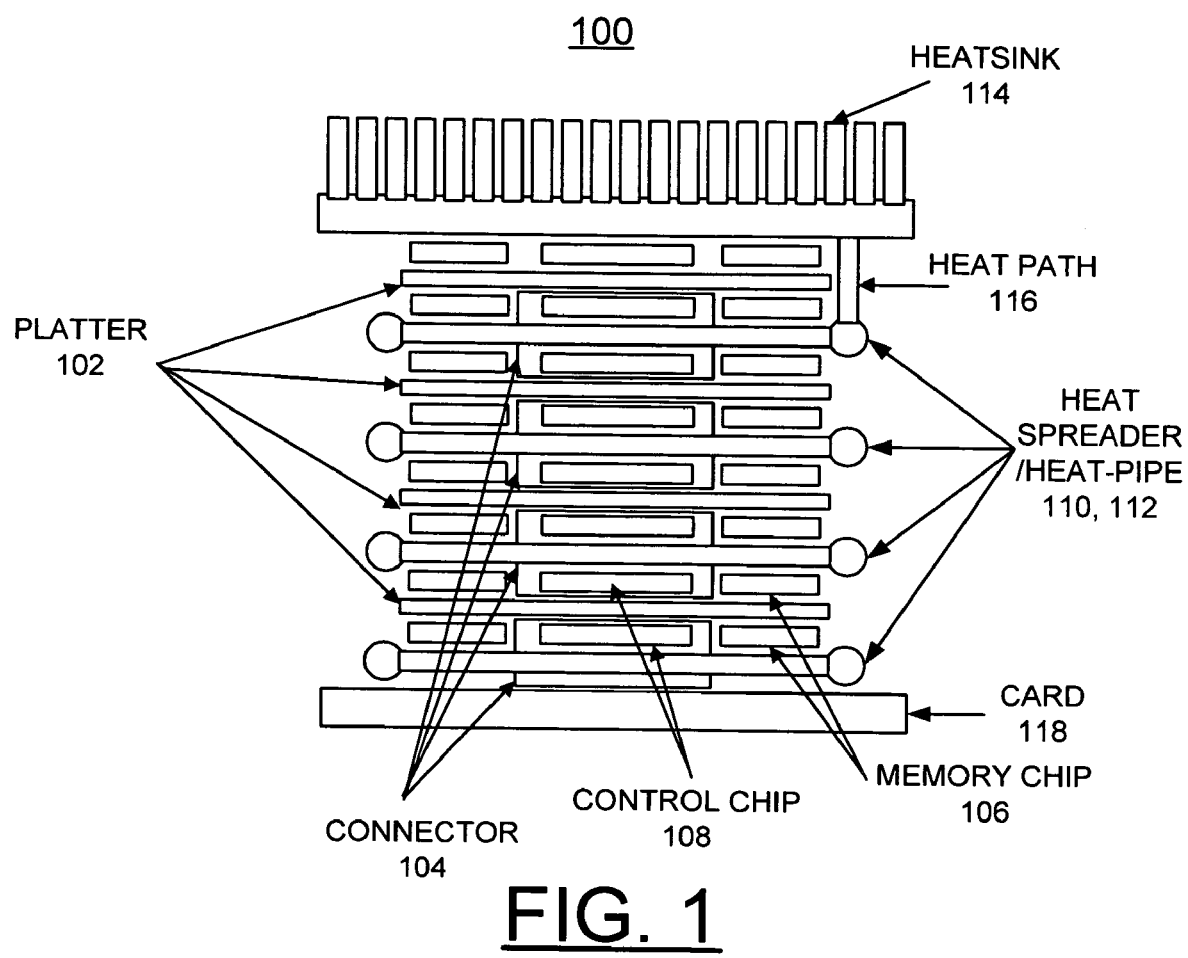
FIG. 1 is a side view not to scale illustrating an exemplary stacked memory structure in accordance with one embodiment of the invention.
Figure 2:
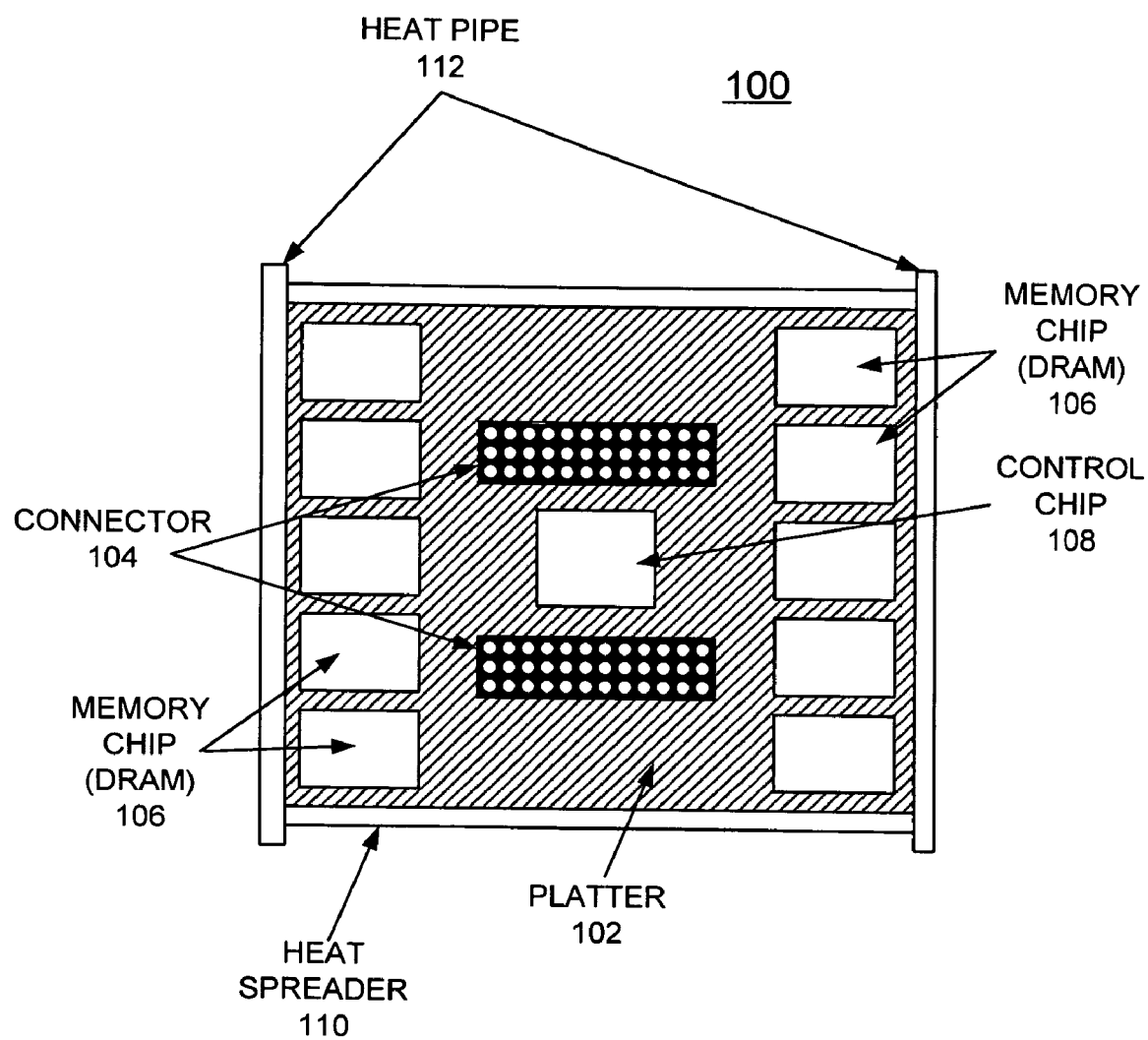
FIG. 2 is a plan view not to scale illustrating a stacking platter of the exemplary stacked memory structure of FIG. 1 in accordance with one embodiment of the invention.

Having reference now to the drawings, in FIGS. 1 and 2, there is shown an exemplary stacked memory structure generally designated by reference character 100 in accordance with one embodiment of the invention.

Stacked memory structure 100 includes a plurality of stacked memory platters 102. As shown in FIG. 1, each memory platter 102 includes a pair of associated connectors 104, a plurality of memory chips 106, and an associated control chip 108 optionally on both top and bottom sides. Stacked memory structure 100 includes a plurality of heat spreader 110 connected to a pair of elongated heat-pipes 112 at opposing side edges. Stacked memory structure 100 includes a heatsink 114 disposed at the top of stacked memory platters 102.

A separate heat path, such as an illustrated heat path 116 defined between the top heat-pipe 112 and heat spreader 110, optionally can be provided between the heatsink 114 and each heat spreader 110. Stacked memory structure 100 includes a circuit board or card 118 that is connected to the stacked memory platters 102 with a respective pair of connectors 104.

It should be understood that the heat-pipe 112 could alternately create the referenced separate heat path 116 by forming the heat-pipe 112 in such a way as to directly carry the heat from the heat spreader 110 to the heatsink 114.

As shown in the exemplary configuration of stacked memory structure 100 in FIG. 1, a respective heat spreader 110 is provided between adjacent memory platters 102. Also one heat spreader 110 optionally is provided between the card 118 and the lowest memory platter 102 in stacked memory structure 100.

The control chip 108 is generally centrally located on the memory platter 102 with the connectors 104 located on opposite sides of the control chip 108 and closely spaced from the control chip. As shown, multiple memory chips 106 are arranged in a line adjacent the edges of the memory platter 102 near the elongated heat-pipes 112 closely spaced from the control chip 108.

It should be understood that the present invention is not limited to the illustrated example configuration of the stacked memory structure 100, various other configurations could be provided within the scope of the invention. For example, a staggered arrangement of multiple memory chips 106 could be provided on one or both sides of the stacked memory platters 102. Also for example, a heat path between each of the heat spreaders 110 and the heatsink 114 using multiple vertically extending heat pipes that could extend through each of the heat spreaders 110 and the heatsink 114. Also for example, the control chip 108 could be placed other than generally in the center of the platter 102 and could be comprised of more than one device.

Stacked memory structure 100 alleviates both cooling and density issues. Stacking platters 102 of respective memory devices 106 together with the respective associated buffer control chip or chips 108, with alternating heat-spreaders 110 connected to heat-pipes 112 at the edges, effectively and efficiently carry heat to a heatsink 114 on the top of the stack.

Each of the plurality of stacked memory platters 102 can be implemented with conventional printed circuit card technologies. The heat-spreaders 106 can be formed of various thermally conductive materials, such as a selected one or combination of Aluminum, Copper, Silicon carbon, Silicon-nitride and other similar materials. The heat-spreaders 110 can be provided in direct contact engagement with the respective memory devices or chips 106 carried by alternate stacked memory platters 102. Also a thermally conductive material can be provided between the respective heat-spreaders 110 and the respective adjacent memory devices or chips 106. Various types of connectors can be used for connectors 104, such as a land grid array (LGA) type connector or a mezzanine type connector.

Further, the proximity of the control chip 108 to the memory chips 106, such as DRAM 106, and the clean in/out path to the control chip 116 lend for much shorter paths through the implementation of memory structure 100. The heatsink 114 also may serve as the retention/pressure plate of the system of connectors 104.

Figure 3A:
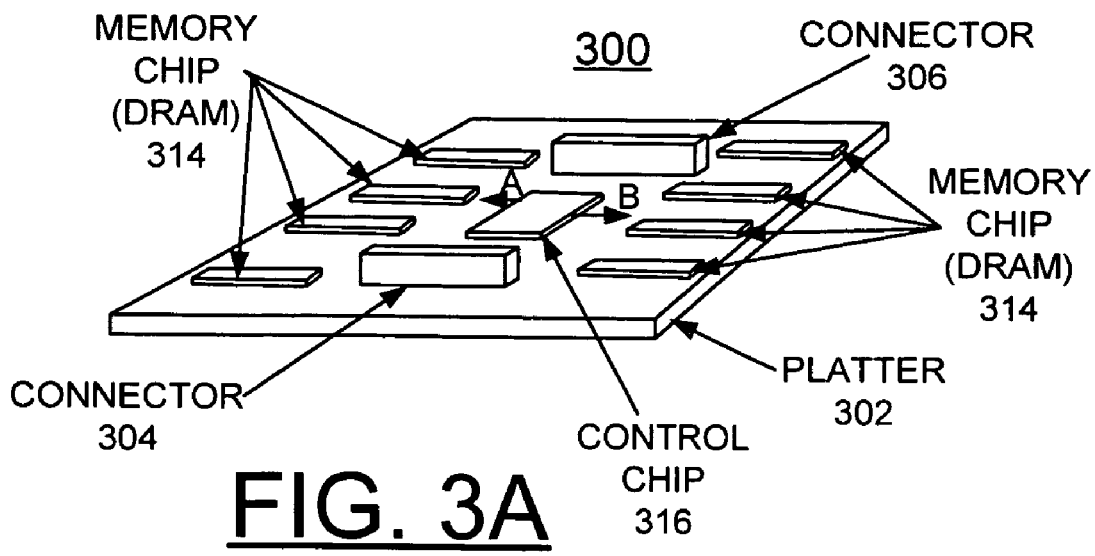
FIG. 3A illustrates not to scale an input/output (I/O) path to memory chips on a memory platter of another exemplary stacked memory structure in accordance with a second embodiment of the invention.
Figure 3B:
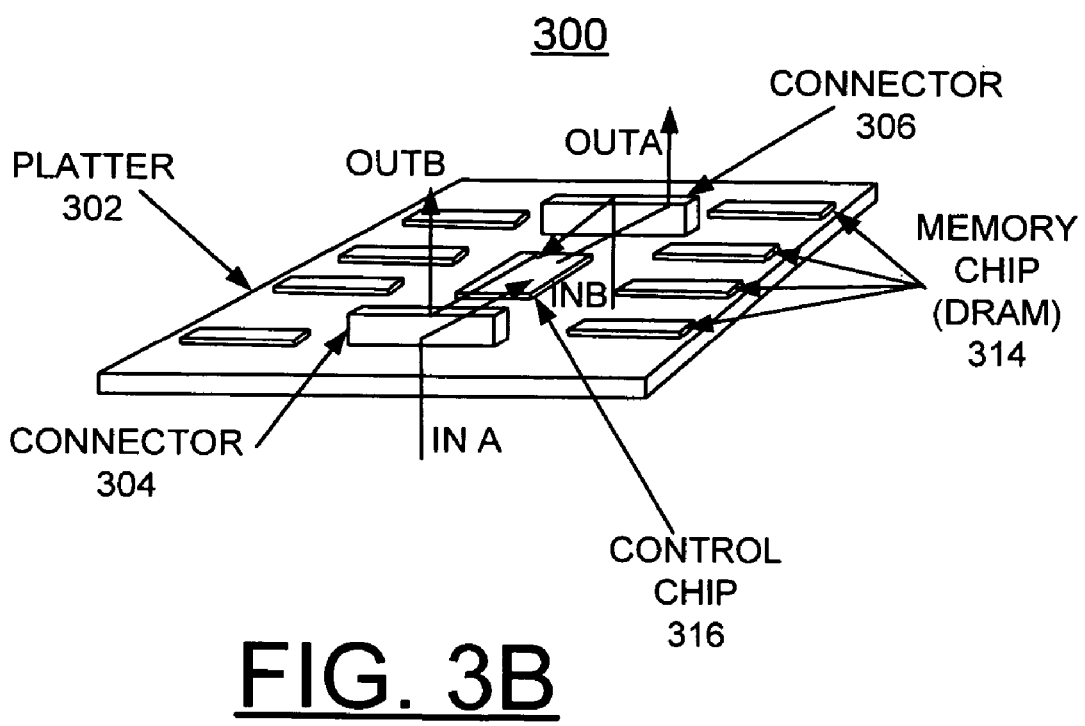
FIG. 3B illustrates not to scale serial interface loops through a pair of connectors and a control chip on the memory platter of the exemplary stacked memory structure of FIG. 3A in accordance with the second embodiment of the invention.

Referring now to FIGS. 3A and 3B, there is shown a second exemplary configuration of an exemplary stacked memory structure generally designated by reference character 300 in accordance with one embodiment of the invention. Stacked memory structure 300 includes a plurality of stacked memory platters 302 (one shown). Each memory platter 302 includes a pair of associated connectors 304, 306, a plurality of memory chips 314, such as DRAM chips, and a control chip 316. The control chip 316 is generally centrally located on the memory platter 302 with connectors 304, 306 located on opposite sides of the control chip 316. The memory chips 314 are arranged in a line along each of the other opposite sides of the control chip 316.

As shown in FIG. 3A, an input/output (I/O) path indicated by a pair of arrows respectively labeled A and B from the control chip 316 to memory chips 314 on a memory platter 302 of stacked memory structure 300 provide a significant net length advantage over the conventional edge mounted DIMM arrangement.

As shown in FIG. 3B, serial interface loops are indicated by a respective pair of arrows respectively labeled IN A and OUT A; and INB and OUT B through respective connectors 304, 306, control chip 316, and respective connectors 306, 304 on the memory platter 302.

Figure 4:
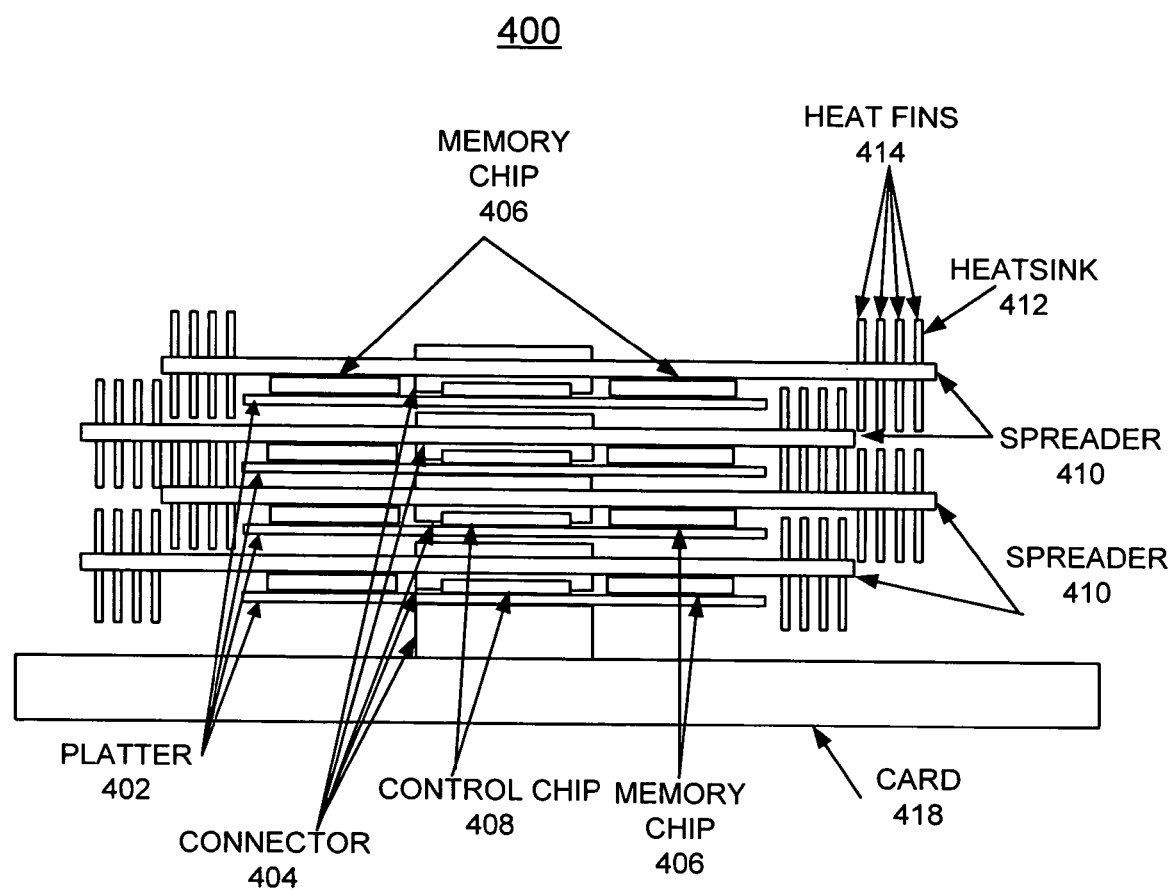
FIG. 4 is a side view not to scale illustrating another exemplary stacked memory structure in accordance with a third embodiment of the invention.

Referring now to FIG. 4, another exemplary stacked memory structure generally designated by reference character 400 in accordance with one embodiment of the invention.

Stacked memory structure 400 includes a plurality of stacked memory platters 402. Each memory platter 402 includes a pair of associated connectors 404, a plurality of memory chips 406, and an associated control chip 408 arranged similarly to the memory platters 102 of the stacked memory structure 100 of FIGS. 1 and 2.

Stacked memory structure 400 includes a plurality of heat spreader 410 connected to a respective heatsink 412 at opposing side edges of the heat spreader. Each heatsink 412 includes a plurality of spaced apart heat fins 414 extending generally perpendicular to the associated heat spreader 410. Stacked memory structure 400 includes a circuit board or card 418 connected to the stacked memory platters 402.

In accordance with features of the stacked memory structures 100, 300, 400 of the preferred embodiments, several advantages are provided in addition to greatly improved cooling. One is the high density this stacked memory structure allows. Stacked memory structures 100, 300, 400 have the potential to double the memory volumetric density in a system yet keeping the path lengths short and cooling manageable. Another advantage is the savings in required heat sinks. Typically heat sinks are required for high speed, intelligent buffer chips on DIMMs. As shown in stacked memory structure 100, the heat pipes 110 allows heat to be efficiently pulled away to the common heat sink 114 at the top of the tower of memory platters 102.

In accordance with features of the preferred embodiments, significant net length advantages are gained over traditional edge mounted DIMMs. The connector pin density of traditional edge mounted DIMMs causes the wires to approach the DIMM in a fairly wide or large physical distance bus, cross the connector to the DIMM, then fan into the central control chip, then fan back out to the connector and repeat the sequence. Stacked memory structures 100, 300, 400 allow the path to stay much shorter both in lengths to and between connectors 104, 304, 404 as well as in any fan-in/out areas.

In accordance with features of the preferred embodiments, memory structures 100, 300, 400 enable adding additional memory chips, logic chips, and the like without sacrificing board space of card 118, 418. For example, each layer or platter 102, 302, 402 could be used for a separate processor with its own memory. The memory structures 100, 300, 400 also can be used to provide error recovery across the layers allowing one layer to be replaced by a redundant layer. The memory structures 100, 300, 400 also allow construction of a memory hierarchy within the stack; for example, such as a cache on a bottom memory platter (L2), a DRAM in the middle memory platter (L3), and a Flash memory in the memory platters (L4).

While the present invention has been described with reference to the details of the embodiments of the invention shown in the drawing, these details are not intended to limit the scope of the invention as claimed in the appended claims.

What is claimed is:

1. A stacked memory structure for implementing enhanced cooling of a plurality of memory devices comprising:

a stack of platters;

the plurality of memory device including dynamic random access memory (DRAM) devices:
a sub-plurality of memory devices mounted on each platter;
at least one connector provided with each platter for connecting to the sub-plurality of memory devices;
a control chip mounted generally centrally located on at least one platter; a group of multiple DRAM devices arranged adjacent to each of a pair of opposing edges of said platter spaced from the control chip; and
a heat sink associated with the stack of platters for cooling the plurality of memory devices.

2. A stacked memory structure as recited in claim 1 includes a heat spreader disposed between at least some of the platters in the stack of platters.

3. A stacked memory structure as recited in claim 2 includes a heat pipe connected to an edge of the heat spreader.

4. A stacked memory structure as recited in claim 1 wherein said heat sink is a unitary member mounted on said stack of platters.

5. A stacked memory structure as recited in claim 4 includes a heat spreader disposed between at least some of the platters in the stack of platters and a heat path defined from said heat spreader to said unitary member heat sink.

6. A stacked memory structure as recited in claim 1 includes a heat spreader disposed between at least some of the platters in the stack of platters and an associated heat sink formed along at least one side of said heat spreader; said heat sink includes a plurality of fins extending generally perpendicular to said heat spreader.

7. A stacked memory structure as recited in claim 1 includes a processor and associated memory of said processor mounted on at least one of said platters.

8. A stacked memory structure as recited in claim 1 wherein said sub-plurality of memory devices includes Flash memory mounted on at least one of said platters.

9. A stacked memory structure as recited in claim 8 includes a heat spreader disposed between at least some of the platters in the stack of platters and wherein said heat spreader is formed of a selected thermally conductive material; and said selected thermally conductive material is a selected one or combination of Aluminum, Copper, Silicon Carbon, and Silicon-nitride.

10. A stacked memory structure as recited in claim 9 wherein said heat-spreader is provided in direct contact engagement with the sub-plurality of memory devices mounted on an adjacent one of the stacked platters.

11. A stacked memory structure as recited in claim 1 wherein said stack of platters include a stack of printed circuit boards.

12. A stacked memory structure as recited in claim 1 wherein one said control chip is mounted on each said platter.

13. A stacked memory structure as recited in claim 1 includes a pair of said connectors located on opposite sides of said control chip.

14. A stacked memory structure as recited in claim 12 includes a group of said multiple DRAM devices arranged adjacent to each of said opposing edges of each said platter.

15. A stacked memory structure as recited in claim 14 includes a heat spreader disposed between a pair of adjacent platters in the stack of platters and a pair of heat pipes respectively connected to an opposing side of said heat spreader; and wherein each said group of said multiple DRAM devices is disposed near one of said heat pipes.

16. A method for implementing enhanced cooling of a plurality of memory devices comprising:
providing a stacked memory structure including a stack of platters;
mounting a sub-plurality of the memory devices on each said platter; the plurality of memory device including dynamic random access memory (DRAM) devices;
mounting at least one connector on each platter for connecting to the sub-plurality of memory devices;
mounting a control chip generally centrally located on at least one platter; mounting a respective one of a pair of said connectors on opposite sides of said control chip; and arranging a group of multiple DRAM devices of said sub-plurality of memory devices adjacent to each of a pair of opposing edges of said platter; and
providing a heat sink with the stack of platters for cooling the plurality of memory devices.

17. A method for implementing enhanced cooling of a plurality of memory devices as recited in claim 16 wherein the step of providing a heat sink with the stack of platters for cooling the plurality of memory devices includes the steps of mounting a heat sink on the stack of platters; and providing a heat spreader between a pair of adjacent platters in the stack of platters; and providing a heat path between said heat spreader and said heat sink.

18. A method for implementing enhanced cooling of a plurality of memory devices as recited in claim 16 wherein the step of providing a heat sink with the stack of platters for cooling the plurality of memory devices includes the steps of providing a heat spreader disposed between at least some of the platters in the stack of platters and forming a heat sink along at least one side of said heat spreader; said heat sink includes a plurality of fins extending generally perpendicular to said heat spreader.

19. A method for implementing enhanced cooling of a plurality of memory devices as recited in claim 16 includes the steps of mounting one said control chip generally centrally on each said platter.

* * * * *